US009941318B2

(12) United States Patent
Hirano et al.

(10) Patent No.: US 9,941,318 B2
(45) Date of Patent: Apr. 10, 2018

(54) SEMICONDUCTOR DEVICE AND ELECTRONIC APPARATUS INCLUDING AN ORGANIC MATERIAL LAYER BETWEEN A DUMMY LENS AND A TRANSPARENT SUBSTRATE

(71) Applicant: SONY CORPORATION, Tokyo (JP)

(72) Inventors: Takaaki Hirano, Kanagawa (JP); Shinji Miyazawa, Kanagawa (JP); Kensaku Maeda, Kanagawa (JP); Yusuke Moriya, Kanagawa (JP); Shunsuke Furuse, Kanagawa (JP); Yutaka Ooka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/621,871

(22) Filed: Jun. 13, 2017

(65) Prior Publication Data
US 2017/0287964 A1 Oct. 5, 2017

Related U.S. Application Data

(63) Continuation of application No. 14/773,820, filed as application No. PCT/JP2014/055927 on Mar. 7, 2014, now Pat. No. 9,728,568.

(30) Foreign Application Priority Data

Mar. 18, 2013 (JP) .................. 2013-054587

(51) Int. Cl.
*H01L 27/146* (2006.01)
*H04N 5/374* (2011.01)

(52) U.S. Cl.
CPC .... *H01L 27/14627* (2013.01); *H01L 27/1464* (2013.01); *H01L 27/14618* (2013.01);
(Continued)

(58) Field of Classification Search
CPC .......... H01L 27/14627; H01L 27/1464; H01L 27/14618; H01L 27/14623; H01L 27/14685; H04N 5/374
See application file for complete search history.

(56) References Cited

U.S. PATENT DOCUMENTS 8,710,608 B2 * 4/2014 Maeda .............. H01L 27/14621
257/291
2012/0044415 A1 * 2/2012 Tsuduki ............ H01L 27/14618
348/374
(Continued)

FOREIGN PATENT DOCUMENTS

JP 2003-338613 A 11/2003
JP 2010-212735 A 9/2010
(Continued)

OTHER PUBLICATIONS

Official Action (and its English Translation) issued in Chinese Patent Application No. 201480010495.4 dated May 22, 2017, 15 pages.
(Continued)

*Primary Examiner* — Padma Haliyur
(74) *Attorney, Agent, or Firm* — Sheridan Ross P.C.

(57) ABSTRACT

Provided is a semiconductor device including: a multilayer substrate including an optical element; a light-transmitting plate provided on the substrate to cover the optical element; and a lens of an inorganic material provided between the substrate and the light-transmitting plate. A structure having a same strength as a strength per unit area of the lens is provided at a portion outside an effective photosensitive region where the optical element is formed, when the substrate is viewed in plan.

28 Claims, 11 Drawing Sheets

(52) U.S. Cl.
CPC .. *H01L 27/14623* (2013.01); *H01L 27/14685* (2013.01); *H04N 5/374* (2013.01)

(56) References Cited

U.S. PATENT DOCUMENTS

2012/0199928 A1* 8/2012 Sawada ............. H01L 27/14625
257/432
2012/0267744 A1 10/2012 Tsuji

FOREIGN PATENT DOCUMENTS

JP      2012-204402 A   10/2012
WO   WO 2012/008387      1/2012

OTHER PUBLICATIONS

Official Action (no English translation available) issued in Japanese Patent Application No. 2015-506700 dated Jun. 20, 2017, 4 pages.

\* cited by examiner

SEMICONDUCTOR DEVICE AND ELECTRONIC APPARATUS INCLUDING AN ORGANIC MATERIAL LAYER BETWEEN A DUMMY LENS AND A TRANSPARENT SUBSTRATE

CROSS-REFERENCE TO RELATED APPLICATIONS

This application is a continuation of U.S. patent application Ser. No. 14/773,820, filed Sep. 9, 2015, which is a national stage application under 35 U.S.C. 371 and claims the benefit of PCT Application No. PCT/JP2014/055927 having an international filing date of Mar. 7, 2014, which designated the United States, which PCT application claimed the benefit of Japanese Patent Application No. 2013-054587 filed Mar. 18, 2013, the disclosures of which are incorporated herein by reference in their entirety.

TECHNICAL FIELD

The present technology relates to semiconductor devices and electronic apparatuses. More particularly, the present technology relates to a semiconductor device and electronic apparatus in which deformation of a lens does not occur.

BACKGROUND ART

In the recent development of semiconductor technologies, the three-dimensional multilayer technique of stacking elements in the vertical direction to construct three-dimensional structure has attracted attention as a Beyond-Moore technique that is an alternative to More-Moore techniques of increasing integration densities. It is difficult to design a two-dimensional layout of interconnection, which leads to large power consumption. It has been proposed that a three-dimensional interconnection layout in which circuit blocks having various functions are divided into multiple layers, and chips are connected together, can reduce power consumption or increase processing speed. It has also been proposed that the use of wafer level packaging, which is a three-dimensional multilayer technique used in a package, can reduce cost and size.

In particular, electronic apparatuses that employ a camera module, such as a mobile telephone, etc., require a further reduction in size. Such a demand is becoming unsatisfied with a conventional structure in which a solid-state image sensor is provided in a ceramic package and a glass plate is attached to a surface so that the solid-state image sensor is sealed.

Therefore, instead of the conventional package structure in which there is a cavity between the glass and the solid-state image sensor, a structure in which a glass plate is attached directly to microlenses is currently under development. It has been proposed that, in such a cavitviess package structure aimed at reducing profile and size, the microlenses are formed of SiN (silicon nitride), which is an inorganic material that has a high refractive index (highly-refractive), in order to make a difference in refractive index between a resin with which a surface portion of the microlenses that is a cavity is filled and the microlenses (see Patent Literature 1).

When the microlens is formed of SiN, which is transparent and has a high refractive index, SiN has a tendency to cause high membrane stress. Therefore, a problem arises that a defective surface such as a blemish or distortion occurs due to a significant difference in membrane stress between the microlens and the underlying resin. To address this problem, it has been proposed that at least one stress reduction layer is interposed (see Patent Literature 2).

CITATION LIST

Patent Literature

Patent Literature 1: JP 2003-338613A
Patent Literature 2: JP 2012-023251A

SUMMARY OF INVENTION

Technical Problem

When the microlens is formed of an inorganic material which has a high refractive index (highly-refractive), such as SiN, etc., on a resin, then if the shape of the microlens layer has a non-uniform region, the balance of stress is lost due to SiN, which has a tendency to cause high membrane stress, so that a wrinkle or distortion is likely to occur.

When such a defective surface such as a wrinkle, distortion, etc., occurs, uniformity or the like in a wafer surface or chip deteriorates, leading to a deterioration in light collection characteristics. Therefore, there is a demand for a configuration that keeps the balance of stress and therefore is free from a wrinkle or distortion.

With these circumstances in mind, the present technology has been made to provide an image sensor that keeps the balance of stress and therefore is free from a wrinkle or distortion, and has good light collection characteristics.

Solution to Problem

According to an aspect of the present technology, there is provided a first semiconductor device including: a multilayer substrate including an optical element; a light-transmitting plate provided on the substrate to cover the optical element; and a lens of an inorganic material provided between the substrate and the light-transmitting plate. A structure having a same strength as a strength per unit area of the lens is provided at a portion outside an effective photosensitive region where the optical element is formed, when the substrate is viewed in plan.

A first organic material layer provided below the lens; and a second organic material layer provided above the lens can be further included.

The structure can have a same shape as the lens and can be formed of the inorganic material.

The structure can be a flat film that is formed of a same material as the lens and has a same volume per unit area as the lens.

The structure can be a flat film that is designed to have a same strength per unit area as the lens.

A film having one end provided as an extension of the lens and the other end connected to a predetermined layer of the substrate can be further included.

The film can be continuously provided to surround the effective photosensitive region.

The film can be discontinuously provided to surround the effective photosensitive region.

The inorganic material can be silicon nitride.

The semiconductor device can be a back-illuminated image sensor.

The semiconductor device can be a front-illuminated image sensor.

The first semiconductor device according to an aspect of the present technology includes a multilayer substrate including an optical element, a light-transmitting plate provided on the substrate to cover the optical element, and a lens of an inorganic material provided between the substrate and the light-transmitting plate. A structure having a same strength as a strength per unit area of the lens is provided at a portion outside an effective photosensitive region where the optical element is formed, when the substrate is viewed in plan.

According to an aspect of the present technology, there is provided a second semiconductor device including: a multilayer substrate including an optical element; a light-transmitting plate provided on the substrate to cover the optical element; and a lens of an inorganic material provided between the substrate and the light-transmitting plate. A portion of the lens is connected to a predetermined layer of the substrate by a film formed of a same material as the lens.

The second semiconductor device according to an aspect of the present technology includes a multilayer substrate including an optical element, a light-transmitting plate provided on the substrate to cover the optical element, and a lens of an inorganic material provided between the substrate and the light-transmitting plate. A portion of the lens is connected to a predetermined layer of the substrate by a film formed of a same material as the lens.

According to an aspect of the present technology, there is provided an electronic apparatus including: a semiconductor device including a multilayer substrate including an optical element, a light-transmitting plate provided on the substrate to cover the optical element, and a lens of an inorganic material provided between the substrate and the light-transmitting plate, in which a structure having a same strength as a strength per unit area of the lens is provided at a portion outside an effective photosensitive region where the optical element is formed, when the substrate is viewed in plan; and a signal processing unit that performs a signal process on a pixel signal output from the semiconductor device.

An electronic apparatus according to an aspect of the present technology includes a multilayer substrate including an optical element, a light-transmitting plate provided on the substrate to cover the optical element, and a lens of an inorganic material provided between the substrate and the light-transmitting plate. Also, a structure having a same strength as a strength per unit area of the lens is provided at a portion outside an effective photosensitive region where the optical element is formed, when the substrate is viewed in plan. Also, a signal process is performed on a pixel signal output from the semiconductor device.

Advantageous Effects of Invention

According to the present technology, an image sensor that keeps the balance of stress and therefore is free from a wrinkle or distortion, and has good light collection characteristics, can be provided.

DESCRIPTION OF EMBODIMENTS

Embodiments for carrying out the present technology (hereinafter referred to as embodiments) will now be described.

Note that description will be provided in the following order.

Figure 1:
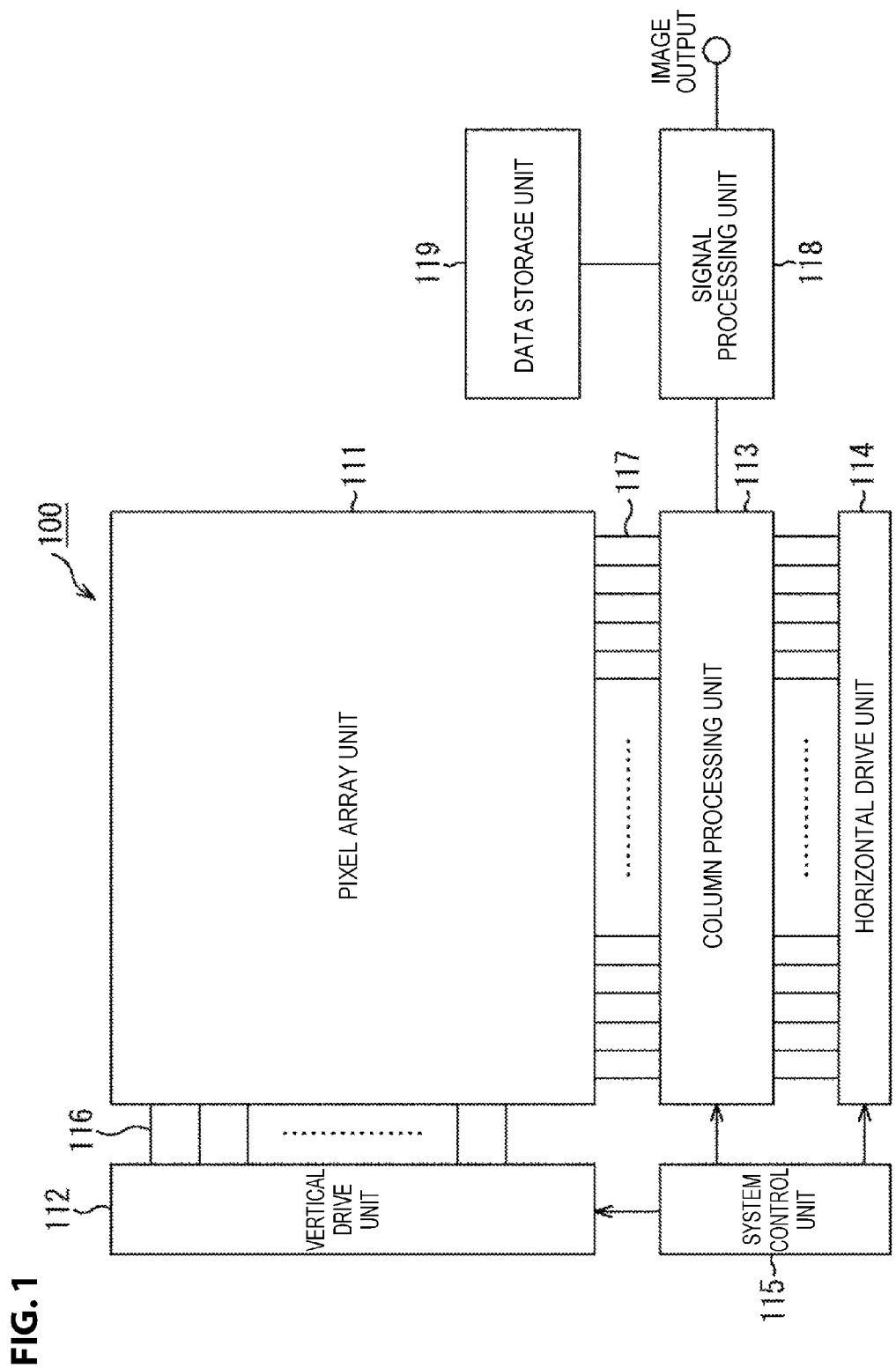
FIG. 1 is a system configuration diagram showing an example configuration of a CMOS image sensor.

1. Configuration of image capture apparatus
2. Configuration of semiconductor package in first embodiment
3. Configuration of semiconductor package in second embodiment
4. Configuration of semiconductor package in third embodiment
5. Configuration of semiconductor package in fourth embodiment
6. Configuration of semiconductor package in fifth embodiment
7. Configuration of semiconductor package in sixth embodiment
8. Configuration of semiconductor package in seventh embodiment
9. Configuration of electronic apparatus Configuration of Image Capture Apparatus FIG. 1 is a system configuration diagram schematically showing a configuration of an image capture apparatus to which the present technology is applicable, such as a CMOS image sensor that is a kind of X-Y addressing image capture apparatus. Here, the CMOS image sensor refers to an image sensor that is produced by utilizing or partially using a CMOS process.

The CMOS image sensor 100 of FIG. 1 includes a pixel array unit 111 that is formed on a semiconductor substrate (not shown), and a peripheral circuit unit that is integrated on the same semiconductor substrate on which the pixel array unit 111 is provided. The peripheral circuit unit includes, for example, a vertical drive unit 112, a column processing unit 113, a horizontal drive unit 114, and a system control unit 115.

The CMOS image sensor 100 further includes a signal processing unit 118 and a data storage unit 119. The signal processing unit 118 and the data storage unit 119 may be mounted on the same substrate on which the CMOS image sensor 100 is provided, or may be provided on another substrate that is different from the substrate on which the CMOS image sensor 100 is provided. Also, a process of each of the signal processing unit 118 and the data storage unit 119 may be a process that is performed by an external signal processing unit, such as a digital signal processor (DSP) circuit or software, that is provided on another substrate that is different from the substrate on which the CMOS image sensor 100 is provided.

The pixel array unit 111 includes unit pixels (hereinafter also simply referred to as "pixels") that have a photoelectric conversion unit that generates and stores photoelectric charge depending on the amount of received light. The unit pixels are two-dimensionally arranged in a row direction and a column direction, i.e., in a matrix. Here, the row direction refers to a direction in which pixels are arranged in a pixel row (i.e., a horizontal direction), and the column direction refers to a direction in which pixels are arranged in a pixel column (i.e., a vertical direction).

In the pixel array unit 111, for the pixels arranged in a matrix, a pixel drive line 116 is provided in the row direction for each pixel row, and a vertical signal line 117 is provided in the column direction for each pixel column. The pixel drive line 116 transmits a drive signal for performing drive when a signal is read from a pixel. Although, in FIG. 1, the pixel drive line 116 is shown as a single interconnect, the pixel drive line 116 is not limited to a single interconnect. One end of the pixel drive line 116 is connected to an output end of a corresponding row of the vertical drive unit 112.

The vertical drive unit 112, which includes a shift register, address decoder, or the like, drives the pixels of the pixel array units 111 all at once or on a row-by-row basis or the like. Specifically, the vertical drive unit 112 includes a system control unit 115 that controls the vertical drive unit 112, and a drive unit that drives each pixel of the pixel array unit 111. Although the detailed configuration of the vertical drive unit 112 is not shown, the vertical drive unit 112 typically includes two scan systems, i.e., a read scan system and a sweep scan system.

The read scan system selectively scans the unit pixels of the pixel array unit 111 successively on a row-by-row basis in order to read signals from the unit pixels. A signal read from the unit pixel is an analog signal. The sweep scan system performs sweep scan on a read row which is to be read out by scanning by the read scan system, a shutter speed time in advance of the read scan.

The sweep scan by the sweep scan system sweeps unnecessary charge from the photoelectric conversion units of the unit pixels in a read row, to reset the photoelectric conversion units. Also, by sweeping unnecessary charge using the sweep scan system (resetting), a so-called electronic shutter operation is performed. Here, the electronic shutter operation refers to an operation of discarding photoelectric charge of the photoelectric conversion unit, and starting another exposure (starting storing photoelectric charge).

A signal read by a read operation by the read scan system corresponds to the amount of light that is received after the immediately previous read operation or an electronic shutter operation. Also, a period of time from the read timing of the immediately previous read operation or the sweep timing of an electronic shutter operation to the read timing of the current read operation, is an exposure time of photoelectric charge in the unit pixel.

Signals output from the unit pixels in a pixel row that have been selectively scanned by the vertical drive unit 112 are input to the column processing unit 13 through the respective vertical signal lines 117 in the respective pixel columns. The column processing unit 113 performs a predetermined signal process on the signals output from the pixels in a selected row through the respective vertical signal lines 117 in the respective pixel columns of the pixel array unit 111, and temporarily holds the pixel signals after the signal process.

Specifically, the column processing unit 113 performs at least a noise removal process, such as correlated double sampling (CDS), as the signal process. The CDS process of the column processing unit 113 removes pixel-specific fixed pattern noise, such as reset noise, variations in threshold of an amplifier transistor in a pixel, or the like. In addition to the noise removal process, the column processing unit 113 may have, for example, an analog-digital (AD) conversion function to convert an analog pixel signal into a digital signal and output the digital signal.

The horizontal drive unit 114, which includes a shift register, address decoder, or the like, successively selects a unit circuit corresponding to a pixel column of the column processing unit 113. By the selective scan performed by the horizontal drive unit 114, a pixel signal that has been subjected to signal processing by each unit circuit in the column processing unit 113 is successively output.

The system control unit 115, which includes a timing generator that generates various timing signals, and the like, performs a drive control on the vertical drive unit 112, the column processing unit 113, the horizontal drive unit 114, and the like, according to the timings generated by the timing generator.

The signal processing unit 118, which has at least a calculation processing function, performs various signal processes, such as a calculation process and the like, on a pixel signal output from the column processing unit 113. The data storage unit 119 temporarily stores data necessary for a signal process performed by the signal processing unit 118.

Configuration of Semiconductor Package in First Embodiment

Figure 2:
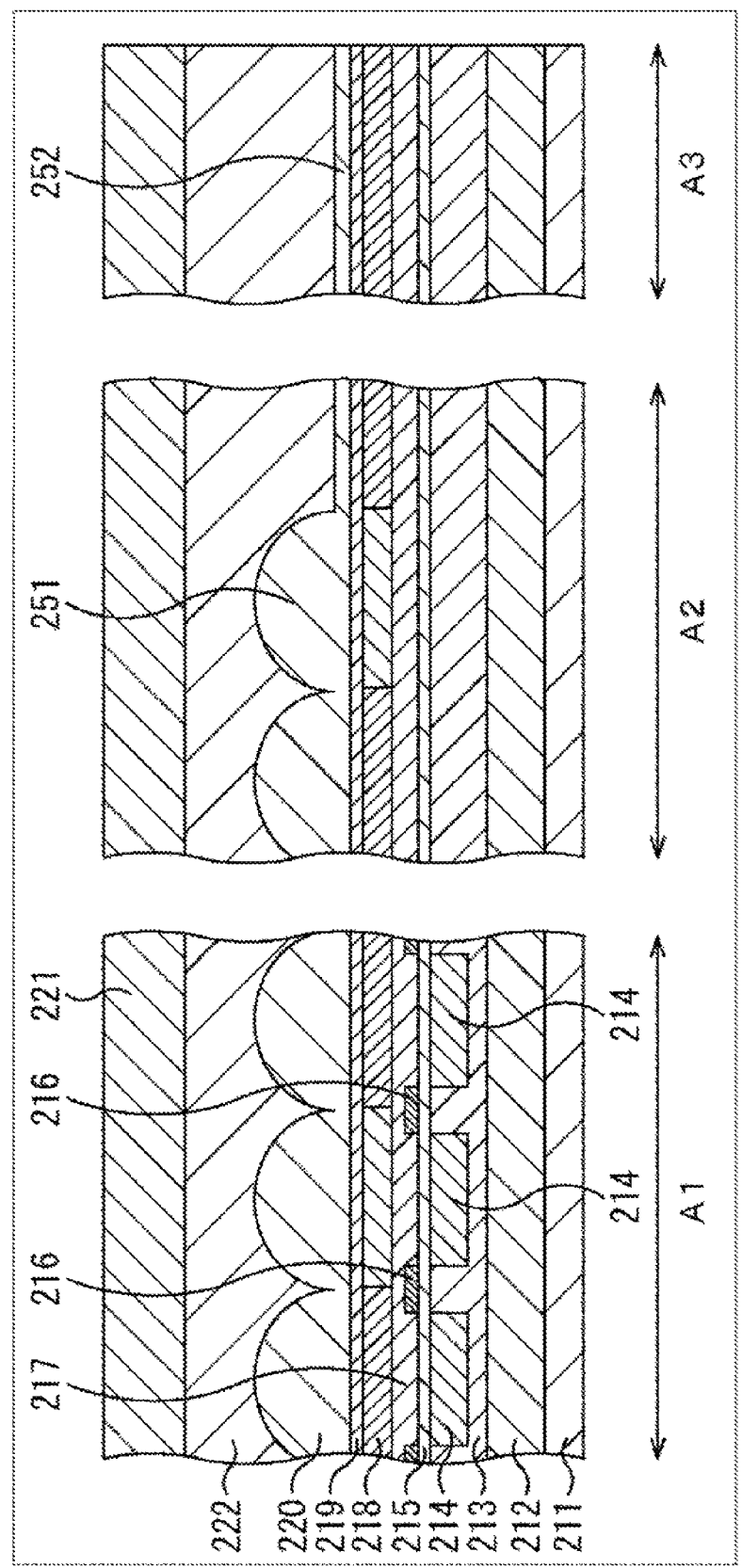
FIG. 2 is a cross-sectional view showing an example configuration of a semiconductor package including a CMOS image sensor to which the present technology is applied.

FIG. 2 is a cross-sectional view schematically showing a basic configuration of a semiconductor package including the CMOS image sensor 100 of FIG. 1 that is an image capture apparatus to which the present technology is applied. The semiconductor package 200 of FIG. 2 includes a back-illuminated CMOS image sensor. Note that, referring to FIG. 3 as well, the semiconductor package 200 is divided into three regions, i.e., an effective pixel region A1, an effective pixel region-surrounding region A2, and an end portion A3, each of which will be described. Firstly, a configuration of the semiconductor package 200 in the effective pixel region A1 will be described.

In the semiconductor package 200 in the effective pixel region A1 shown in FIG. 2, an interconnection layer 212 of $SiO_2$ is formed on a support substrate 211, and a silicon substrate 213 is formed on the interconnection layer 212. The support substrate 211 is formed of silicon, glass epoxy, glass, plastic, or the like. On a surface of the silicon substrate 213, a plurality of photodiodes 214 (optical elements) that are the photoelectric conversion units of the pixels are formed and spaced at predetermined intervals.

A protective film 215 of $SiO_2$ is formed on the silicon substrate 213 and the photodiode 214. On the protective film 215, a light shield film 216 for preventing light from leaking into adjacent pixels is formed between adjacent photodiodes 214. A planarization film 217 for planarizing a region where a color filter is formed is formed on the protective film 215 and the light shield film 216.

A color filter layer 218 is formed on the planarization film 217. A plurality of color filters are provided on the color filter layer 218 for the respective pixels. The colors of the color filters are arranged in the Bayer pattern, for example.

A first organic material layer 219 is formed on the color filter layer 218. The first organic material layer 219 is formed of an acrylic resin material, styrene-based resin material, epoxy resin material, or the like. A microlens layer 220 is formed on the first organic material layer 219. Thus, the microlens layer 220 is provided on the multilayer substrate including the photodiodes 214. A microlens for collecting and bringing light to the photodiode 214 of a pixel is formed in the microlens layer 220 for each pixel. The microlens layer 220, which is an inorganic material layer, is formed of SiN, SiO, SiOxNY (where 0<x≤1 and 0<y≤1).

A cover glass 221 is attached onto the microlens layer 220 with a second organic material layer 222 being interposed between the cover glass 221 and the microlens layer 220. The cover glass 221 is not limited to glass, and may be a light-transmitting plate of a resin or the like. A protective film for preventing infiltration of water or impurities may be formed between the microlens layer 220 and the cover glass 221.

The second organic material layer 222 is formed of an acrylic resin material, styrene-based resin material, epoxy resin material, or the like, as with the first organic material layer 219.

Figure 3:
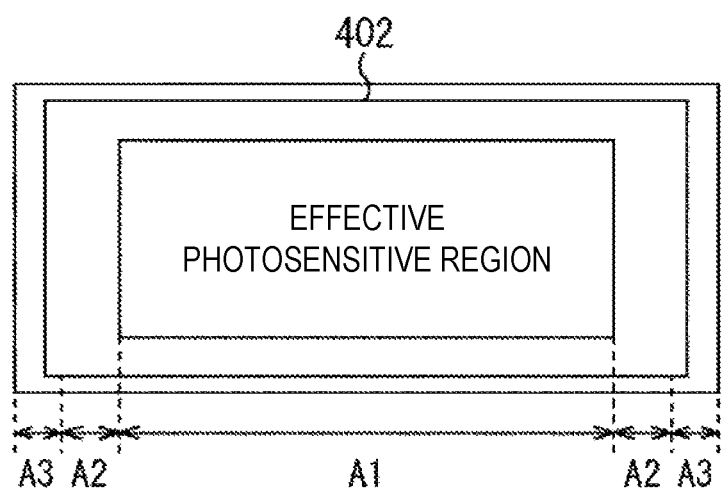
FIG. 3 is a diagram for describing regions.

Here, a configuration of the microlens layer 220 will be described with reference to FIG. 3 in addition to FIG. 2. FIG. 3 is a plan view schematically showing a configuration of the semiconductor package 200. The semiconductor package 200 is roughly divided into an effective photosensitive region A1, an effective photosensitive region-surrounding region A2, and an end portion A3.

The effective photosensitive region A1 is a region where the pixels having the photodiode 214 are provided on a surface of the silicon substrate 213. The effective photosensitive region A1 is a region where the pixels having the photodiode 214 are not provided, and which is provided around the effective photosensitive region A1. The end portion A3 is a region for cleaving, for example, a wafer into the semiconductor packages 200, which includes an end portion (hereinafter referred to as a chip end) of the semiconductor package 200.

Incidentally, the microlens layer 220 is interposed between the first organic material layer 219 and the second organic material layer 222. Of recent chip size packages (CSPs), a cavityless CSP is becoming widespread in order to reduce the profile and size. In the cavityless CSP, the inorganic material SiN, having a high refractive index (highly-refractive), is mostly used as a material for the microlens layer 220 in order to make a difference in refractive index between a less-refractive resin filling a space (corresponding to the second organic material layer 222) and the microlens layer 220.

In such a structure, SiN forming the microlens layer 220 has high membrane stress, and the microlens layer 220 is surrounded by the resin of the second organic material layer 222. In such a state, when temperature is high, the second organic material layer 222 around the microlens layer 220 may be softened, so that membrane stress is reduced, and therefore, the lens of the microlens layer 220 may be deformed. The deformation of the lens would lead to deterioration of image quality, such as shading, color shading, or the like, and therefore, it is necessary to prevent such deformation of the lens.

Therefore, as shown in FIG. 2, a dummy lens 251 is provided in the effective photosensitive region-surrounding region A2. The dummy lens 251 is formed of the same material as that of the microlens layer 220 (the inorganic material SiN (silicon nitride), or the like), and has the same size and shape as those of the lens of the microlens layer 220. In other words, although it is not essentially necessary to provide the microlens layer 220 in the effective photosensitive region-surrounding region A2, the deformation of the lens can be prevented by extending the microlens layer 220 to the effective photosensitive region-surrounding region A2 and thereby providing the dummy lens 251.

The above dummy lens 251 can be formed during formation of the microlens layer 20, and therefore, can be formed without an increase in the number of steps.

Thus, if a structure having the same strength per unit area as that of the microlens layer 220 is formed of the same material (inorganic material) as that of the microlens layer 220 in the effective pixel region-surrounding region A2, stress can be balanced between the microlens layer 220 and the dummy lens 251.

In the end portion A3, provided is a flat film 252 that has a shape different from that of the lens of the microlens layer 220 and is formed of the same material as that of the microlens layer 220 or the dummy lens 251, as an extension of the dummy lens 251 in the effective photosensitive region-surrounding region A2. Note that the film 252 may not be formed of the same material as that of the microlens layer or the dummy lens 251.

Thus, by providing the dummy lens 251, stress can be balanced between the microlens layer 220 in the effective photosensitive region A1 and the dummy lens 251, deformation of the microlens layer 220 can be prevented.

Configuration of Semiconductor Package in Second Embodiment

Figure 4:
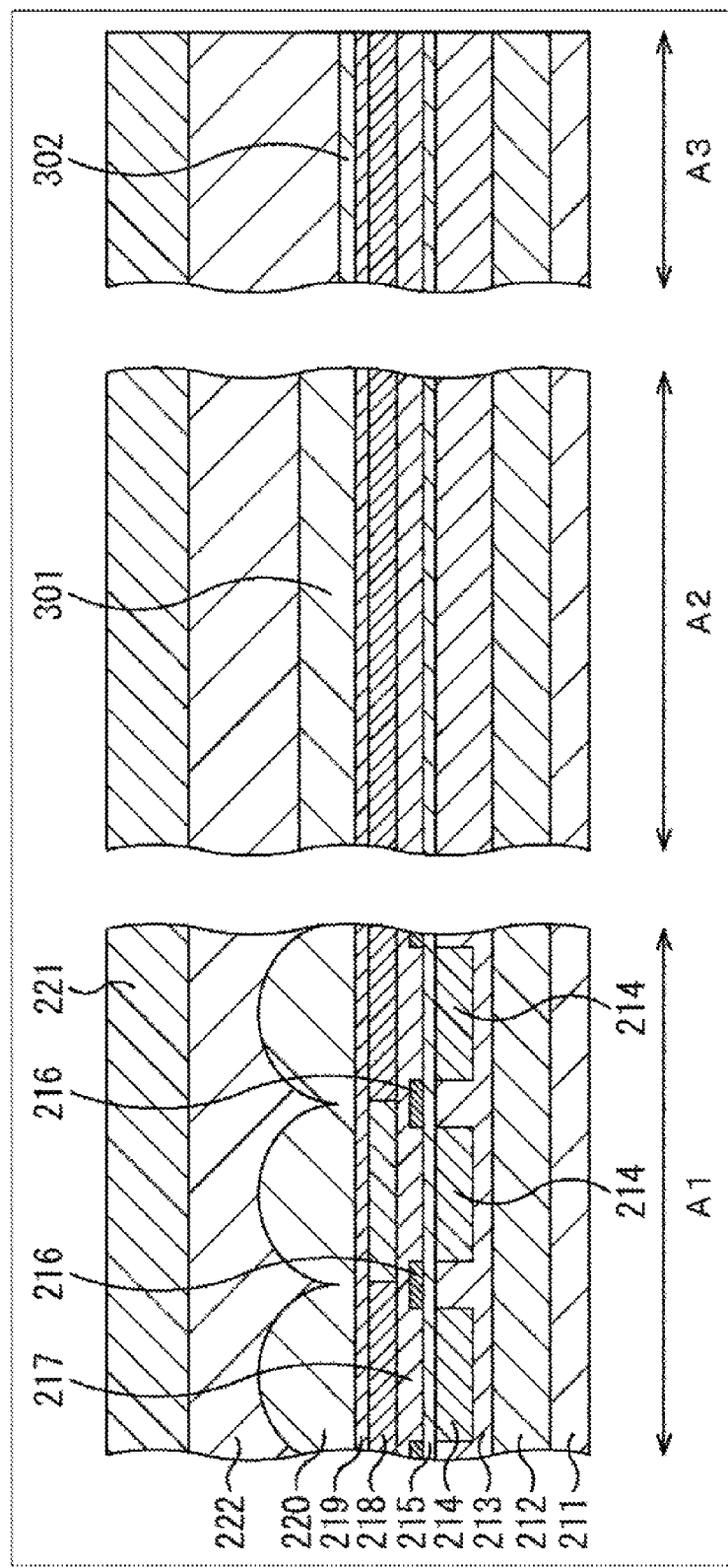
FIG. 4 is a cross-sectional view showing a configuration of a semiconductor package in a second embodiment.

FIG. 4 is a diagram showing a configuration of a semiconductor package in a second embodiment. The same parts of the semiconductor package shown in FIG. 4 as those of the semiconductor package of the first embodiment shown in FIG. 2 are indicated by the same reference characters and will not be described. In the other drawings, similarly, the same parts as those of the semiconductor package of the first embodiment are indicated by the same reference characters and will not be described Although semiconductor packages in the second to sixth embodiments will be described below, all the semiconductor packages have the same configuration in the effective photosensitive region A1, which will not be described. Different configurations which are provided in the effective photosensitive region-surrounding region A2 or/and the end portion A3 will be described.

In the semiconductor package 200 in the second embodiment shown in FIG. 4, the configuration in the effective photosensitive region-surrounding region A2 is different from that of the semiconductor package 200 in the first embodiment shown in FIG. 2. A stress adjustment film 301 is provided instead of the dummy lens 251 in the effective photosensitive region-surrounding region A2 of the semiconductor package 200 shown in FIG. 4.

The stress adjustment film 301 is a flat film that has the same volume per unit area as that of the lens of the microlens layer 220. The stress adjustment film 301 is formed of the same material as that of the microlens layer 220.

In the end portion A3, provided is a flat film 302 formed of the same or different material as or from that of the microlens layer 220.

Thus, by providing the flat stress adjustment film 301 having the same volume per unit area as that of the lens of the microlens layer 220, stress can be balanced between the microlens layer 220 in the effective photosensitive region A1 and the stress adjustment film 301, and therefore, deformation of the microlens layer 220 can be prevented.

Configuration of Semiconductor Package in Third Embodiment

Figure 5:
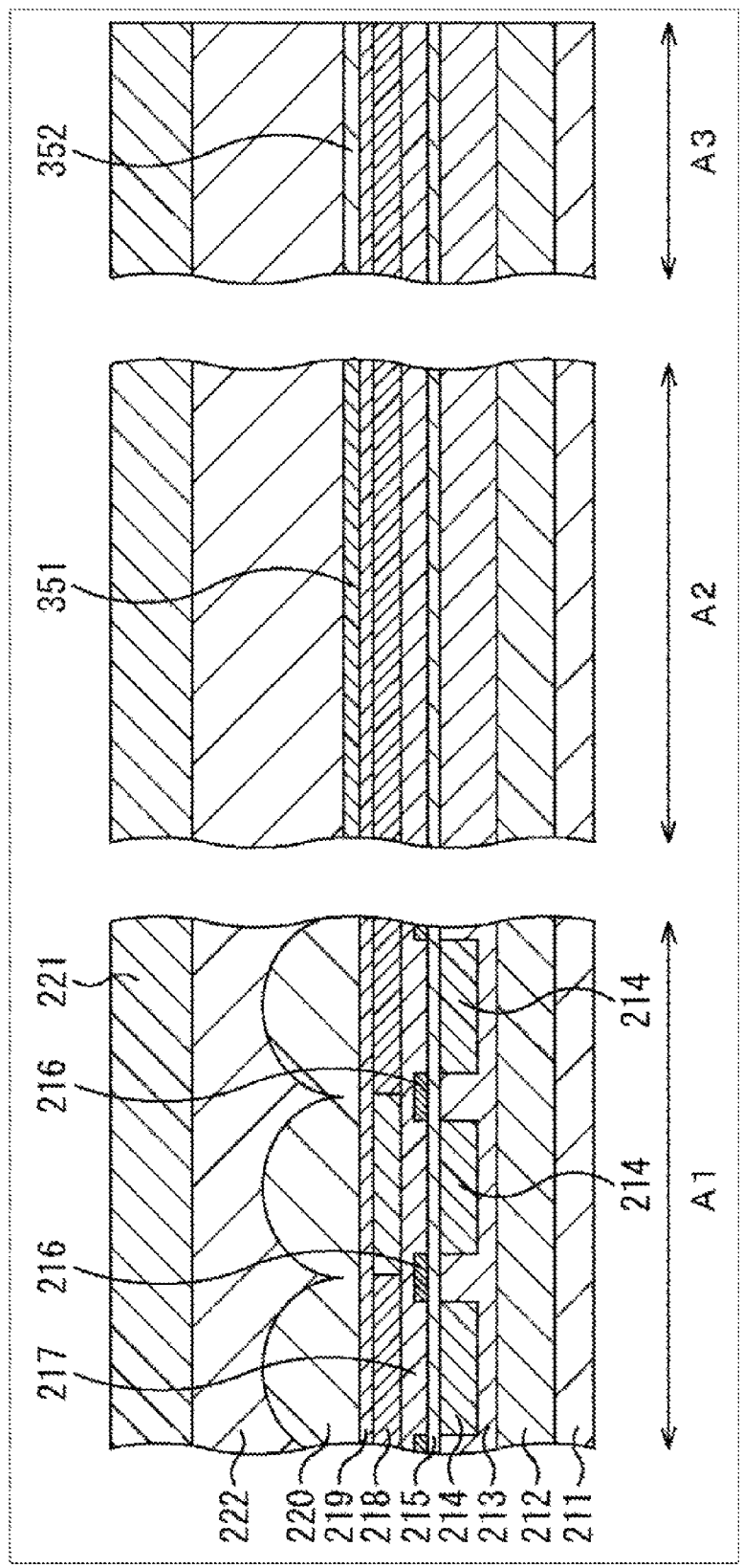
FIG. 5 is a cross-sectional view showing a configuration of a semiconductor package in a third embodiment.

FIG. 5 is a diagram showing a configuration of a semiconductor package in a third embodiment. A semiconductor package 200 in the third embodiment shown in FIG. 5 is different from the semiconductor package 200 in the first embodiment shown in FIG. 2 in the configuration of the effective photosensitive region-surrounding region A2. A stress adjustment film 351 is provided in the effective photosensitive region-surrounding region A2 of the semiconductor package 200 shown in FIG. 5, instead of the dummy lens 251.

The stress adjustment film 351 is formed as a flat film, as with the stress adjustment film 301 shown in FIG. 4. The stress adjustment film 351, which is formed of a material that is different from that of the lens of the microlens layer 220, is designed to have a thickness and stress that provide the same strength per unit area as that of the microlens layer 220.

In the end portion A3, provided is a flat film 352 formed of the same or different material as or from that of the microlens layer 220.

Thus, by providing the flat stress adjustment film 351 that has the same strength per unit area as that of the lens of the microlens layer 220, stress can be balanced between the microlens layer 220 in the effective photosensitive region A1 and the stress adjustment film 351, and therefore, deformation of the microlens layer 220 can be prevented.

Configuration of Semiconductor Package in Fourth Embodiment

Figure 6:
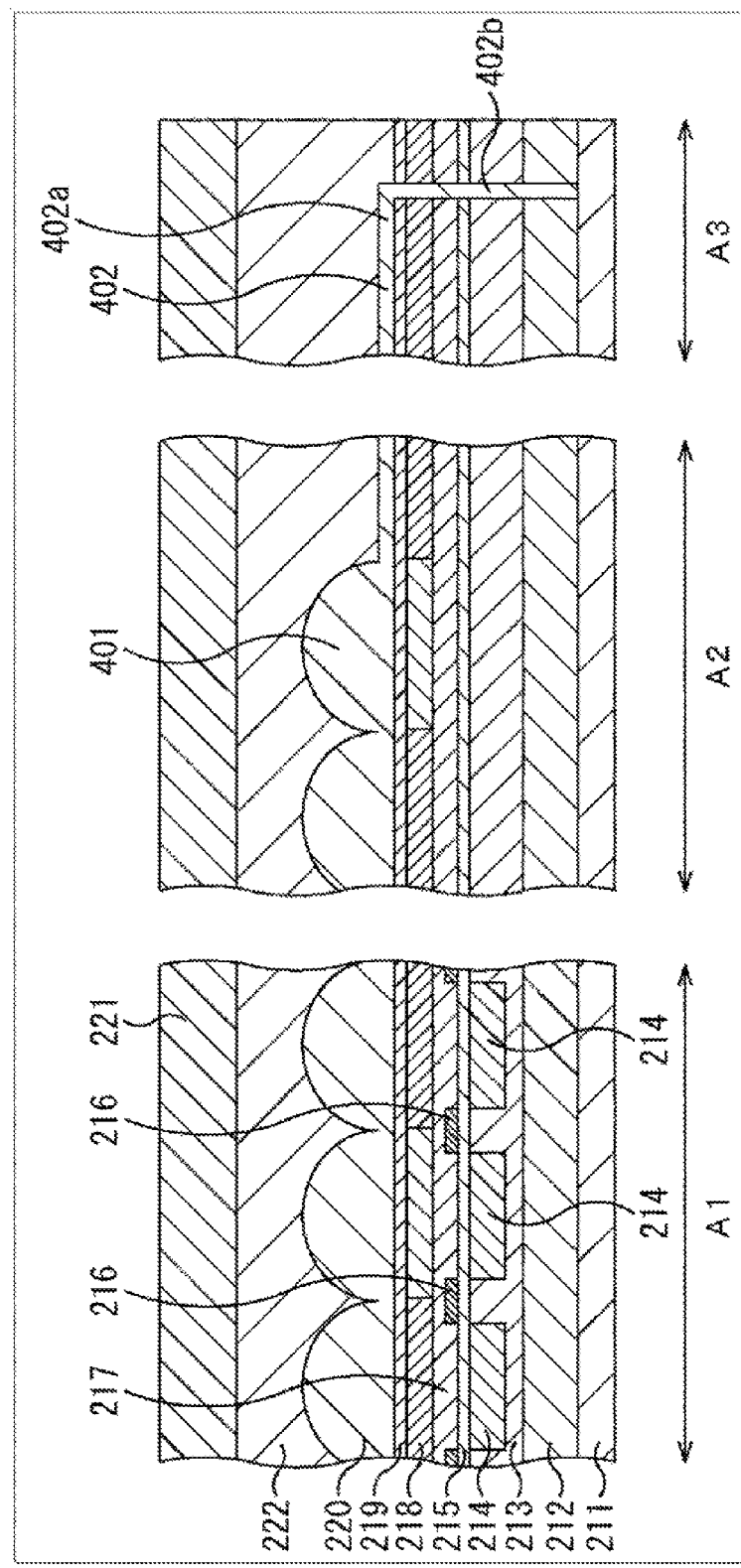
FIG. 6 is a cross-sectional view showing a configuration of a semiconductor package in a fourth embodiment.

FIG. 6 is a diagram showing a configuration of a semiconductor package in a fourth embodiment. The semiconductor package 200 in the fourth embodiment shown in FIG. 6 is different from the semiconductor package 200 in the first embodiment shown in FIG. 2 in the configuration of the end portion A3. A dummy lens 401 is provided in the effective photosensitive region-surrounding region A2 of the semiconductor package 200 shown in FIG. 6 as in the semiconductor package 200 in the first embodiment shown in FIG. 2, and in addition, an anchoring 402 is provided in the end portion A3.

As shown in FIG. 6, the anchoring 402 provided in the end portion A3 has an L-shape. The anchoring 402 includes a horizontal film 402a and a vertical film 402b. The horizontal film 402a is provided horizontally with respect to the support substrate 211 and the like, and the vertical film 402b is provided vertically with respect to the support substrate 211 and the like.

One end of the horizontal film 402a is formed as an extension of the dummy lens 401, and the other end is formed as one end of the vertical film 402b. Also, the other end of the vertical film 402b is in contact with the support substrate 211, or penetrates into the support substrate 211. FIG. 6 shows a case where the other end of the vertical film 402b is in contact with the support substrate 211.

The anchoring 402 in the end portion A3 is formed of the same or different material as or from that of the microlens layer 220. Although it is assumed that one end of the vertical film 402b of the anchoring 402 is connected to the support substrate 211, one end of the vertical film 402b of the anchoring 402 may be connected to another portion. Also, the horizontal film 402a and the vertical film 402b may have the same thickness. Alternatively, for example, the vertical film 402b may be formed to be thicker than the horizontal film 402a.

Thus, by providing the dummy lens 251, stress can be balanced between the microlens layer 220 in the effective photosensitive region A1 and the dummy lens 251, and therefore, deformation of the microlens layer 220 can be prevented. Moreover, by providing the anchoring 402 in the end portion A3, and connecting the anchoring 402 to another portion, such as the support substrate 211 or the like, so that the anchoring 402 is physically fixed, deformation of the microlens layer 220 can be further prevented.

Configuration of Semiconductor Package in Fifth Embodiment

Figure 7:
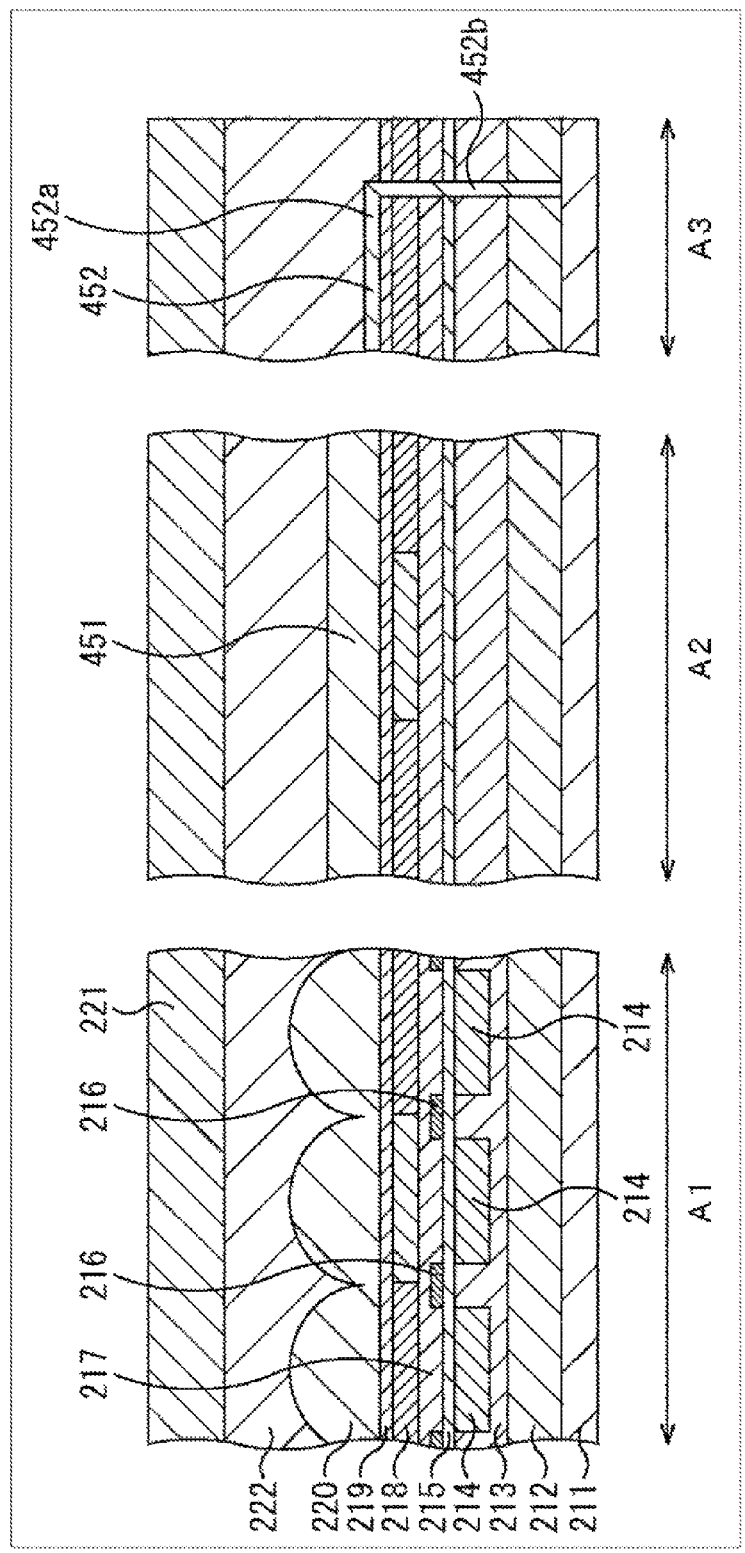
FIG. 7 is a cross-sectional view showing a configuration of a semiconductor package in a fifth embodiment.

FIG. 7 is a diagram showing a configuration of a semiconductor package in a fifth embodiment. The semiconductor package 200 in the fifth embodiment shown in FIG. 7 includes a stress adjustment film 451 as in the effective photosensitive region-surrounding region A2 of the semiconductor package 200 in the second embodiment shown in FIG. 4, and an anchoring 452 as in the end portion A3 of the semiconductor package 200 in the fourth embodiment shown in FIG. 6.

The anchoring 452 provided in the end portion A3 has an L-shape as with the anchoring 402 of FIG. 6. A horizontal film 452a is provided horizontally with respect to the support substrate 211 and the like, and a vertical film 452b is provided vertically with respect to the support substrate 211 and the like.

One end of the horizontal film 452a is formed as an extension of the stress adjustment film 451, and the other end is formed as one end of the vertical film 452b. Also, the other end of the vertical film 452b is in contact with the support substrate 211, or penetrates into the support substrate 211. FIG. 7 shows a case where the other end of the vertical film 452b is in contact with the support substrate 211.

As described above with reference to FIG. 4, the stress adjustment film 451 is a flat film having the same volume per unit area as that of the lens of the microlens layer 220, and is formed of the same material as that of the microlens layer 220. Although the anchoring 452 is formed as an extension of the stress adjustment film 451 thus configured, the stress adjustment film 451 and the anchoring 452 may not have the same thickness. Also, the anchoring 452 may be formed of the same or different material as or from that of the microlens layer 220 or the stress adjustment film 451.

Thus, by providing the flat stress adjustment film 451 having the same volume per unit area as that of the lens of the microlens layer 220, stress can be balanced between the microlens layer 220 in the effective photosensitive region A1 and the stress adjustment film 451, and therefore, deformation of the microlens layer 220 can be prevented. Moreover, by providing the anchoring 452 in the end portion A3, and connecting the anchoring 452 to another portion, such as the support substrate 211 or the like, so that the anchoring 452 is physically fixed, deformation of the microlens layer 220 can be further prevented.

Configuration of Semiconductor Package in Sixth Embodiment

Figure 8:
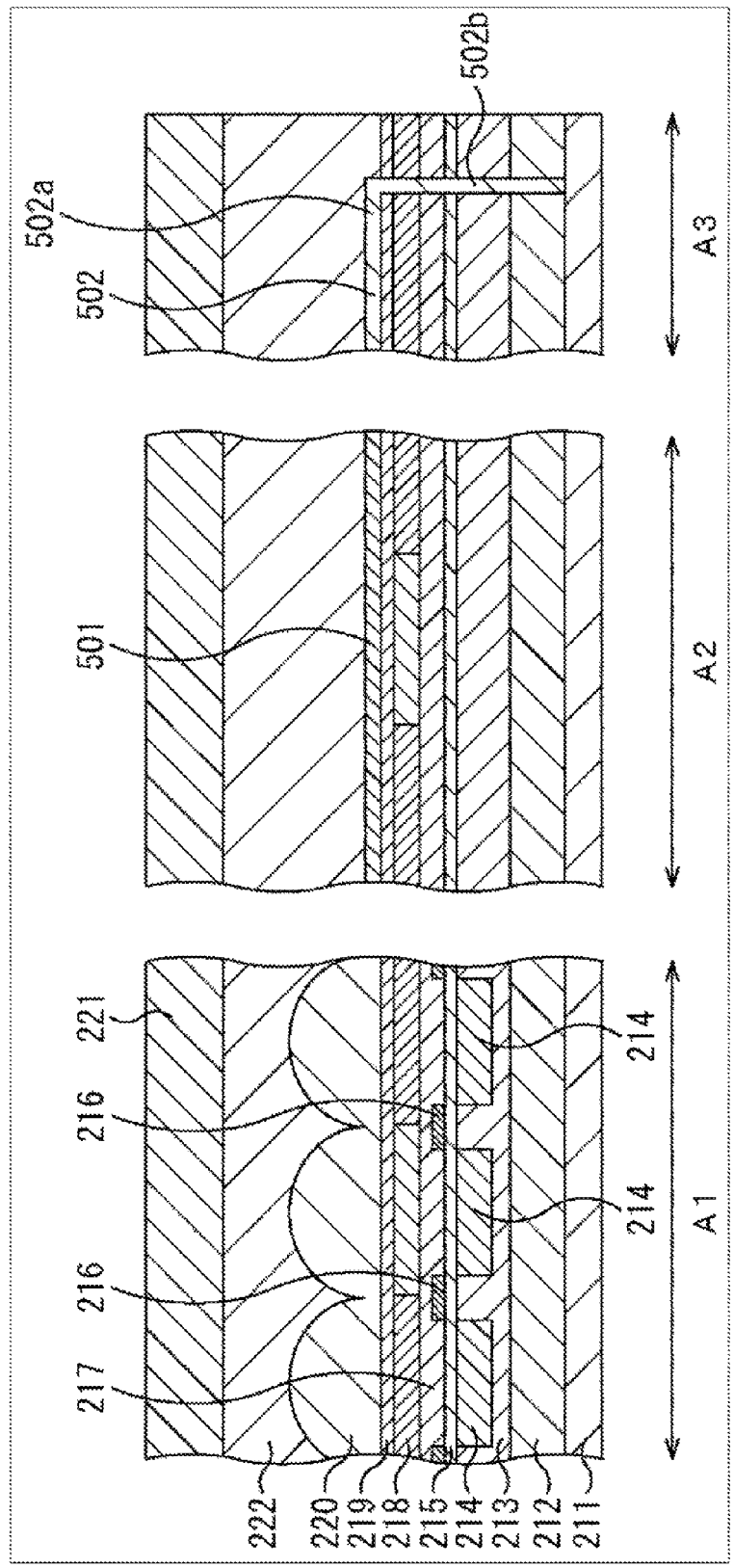
FIG. 8 is a cross-sectional view showing a configuration of a semiconductor package in a sixth embodiment.

FIG. 8 is a diagram showing a configuration of a semiconductor package in a sixth embodiment. The semiconductor package 200 in the sixth embodiment shown in FIG. 8 includes a stress adjustment film 501 as in the effective photosensitive region-surrounding region A2 of the semiconductor package 200 in the third embodiment shown in FIG. 5, and an anchoring 502 as in the end portion A3 of the semiconductor package 200 in the fourth embodiment shown in FIG. 6.

The anchoring 502 provided in the end portion A3 has an L-shape as with the anchoring 402 shown in FIG. 6. A horizontal film 502a is provided horizontally with respect to the support substrate 211 and the like, and a vertical film 502b is provided vertically with respect to the support substrate 211 and the like.

One end of the horizontal film 502a is formed as an extension of the stress adjustment film 501, and the other end is formed as one end of the vertical film 502b. Also, the other end of the vertical film 502b is in contact with the support substrate 211, or penetrates into the support substrate 211. FIG. 8 shows a case where the other end of the vertical film 502b is in contact with the support substrate 211.

As described above with reference to FIG. 5, the stress adjustment film 501, which is formed of a material that is different from that of the lens of the microlens layer 220, is designed to have a thickness and stress that provide the same strength per unit area as that of the microlens layer 220. Although the anchoring 502 is formed as an extension of the stress adjustment film 501 thus configured, the stress adjustment film 501 and the anchoring 502 may not have the same thickness. Also, the anchoring 502 may be formed of the same or different material as or from that of the microlens layer 220 or the stress adjustment film 501.

Thus, by providing the flat stress adjustment film 501 having the same volume per unit area as that of the lens of the microlens layer 220, stress can be balanced between the microlens layer 220 in the effective photosensitive region A1 and the stress adjustment film 501, and therefore, deformation of the microlens layer 220 can be prevented. Moreover, by providing the anchoring 502 in the end portion A3, and connecting the anchoring 502 to another portion, such as the support substrate 211 or the like, so that the anchoring 502 is physically fixed, deformation of the microlens layer 220 can be further prevented.

Here, referring back to FIG. 3, a way to provide an anchoring will be described. Here, of the anchoring 402 (FIG. 6), the anchoring 452 (FIG. 7), and the anchoring 502 (FIG. 8), the anchoring 402 will be described by way of example. A description below is also applicable to the anchoring 452 and the anchoring 502.

Referring to FIG. 3, three quadrangles are shown in FIG. 3. The innermost quadrangle represents the effective photosensitive region A1, and the second innermost quadrangle represents the anchoring 402. Specifically, in the example shown in FIG. 3, the anchoring 402 is continuously provided to surround the effective photosensitive region A1. Thus, by continuously providing the anchoring 402 to surround the chip, the anchoring 402 can have the effect of a sealing member that prevents water absorption.

Figure 9:
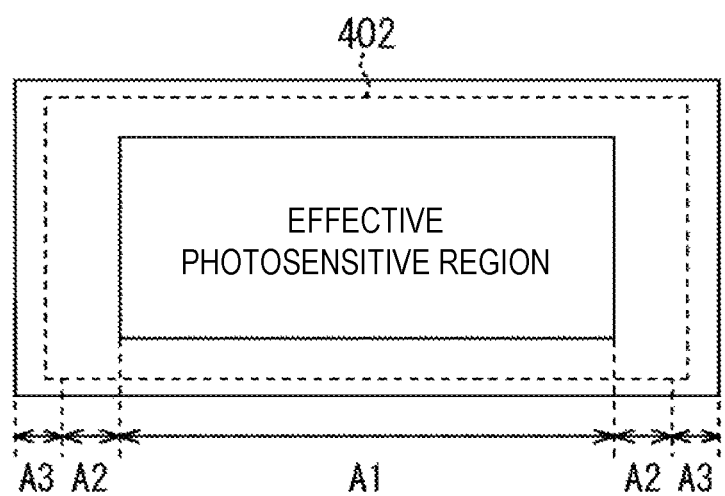
FIG. 9 is a diagram for describing an arrangement of an anchoring.

Alternatively, as shown in FIG. 9, the anchoring 402 may be discontinuously provided. FIG. 9 shows three quadrangles as in FIG. 3. The innermost quadrangle represents the effective photosensitive region A1, and the second innermost quadrangle illustrated by a dashed line represents the anchoring 402.

For example, the anchoring 402 may not be continuously provided, due to interconnection or the like. Also, even if the anchoring 402 is not continuously provided, deformation of the lens of the microlens layer 220 can be prevented. Therefore, as shown in FIG. 9, the anchoring 402 may be discontinuously provided. Note that when the anchoring 402 may be discontinuously provided, the anchoring 402 is preferably uniformly provided. If the anchoring 402 is uniformly provided, deformation of the lens of the microlens layer 220 can be more reliably prevented.

Configuration of Semiconductor Package in Seventh Embodiment

Figure 10:
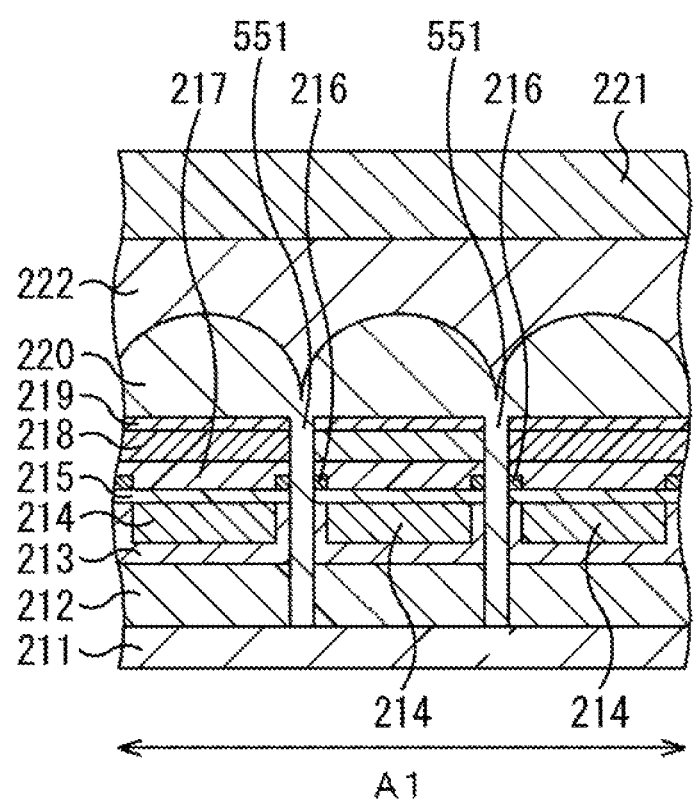
FIG. 10 is a cross-sectional view showing a configuration of a semiconductor package in a seventh embodiment.

FIG. 10 is a diagram showing a configuration of a semiconductor package in a seventh embodiment. The semiconductor package 200 in the seventh embodiment includes a connection unit 551 in the effective photosensitive region A1 to prevent deformation of the lens of the microlens layer 220.

The connection unit 551 is formed of the same material as that of the microlens layer 220, extending in the vertical direction with respect to each layer. Also, the connection unit 551 is provided between each lens in an optically non-effective region between each pixel. One end of the connection unit 551 forms a portion of the microlens layer 220, and the other end is in contact with the support substrate 211 or penetrates into the support substrate 211. FIG. 10 shows a case where the other end of the connection unit 551 is in contact with the support substrate 211.

As shown in FIG. 10, the connection unit 551 may be provided for each lens of the microlens layer 220, or may be provided for each group of lenses (equally spaced).

Thus, by providing the connection unit 551, even under a situation that the lens of the microlens layer 220 would be deformed, the deformation can be prevented by the connection unit 551. Therefore, deformation of the lens of the microlens layer 220 can be prevented.

Note that the configuration of the semiconductor package in the seventh embodiment may be combined with the configuration of any of the semiconductor packages in the first to sixth embodiments. Specifically, the connection unit 551 may be provided in the effective photosensitive region A1 according to the seventh embodiment, and in addition, a dummy lens or stress adjustment film may be provided in the effective photosensitive region-surrounding region A2, and an anchoring may be provided in the end portion A3.

Although, in the above embodiments, a cavityless CSP has been described by way of example, the applicable range of the present technology is not limited to cavityless CSPs, and the present technology is also applicable to other CSPs. Also, although, in the above embodiments, a back-illuminated semiconductor package has been described by way of example, the present technology is also applicable to a front-illuminated semiconductor package or the like, for example.

The present technology is applicable to a case where a lens is provided and is likely to be deformed.

Configuration of Electronic Apparatus

The above semiconductor package is applicable to substantially any electronic apparatus that employs a semiconductor package as an image capture unit (photoelectric conversion unit), such as image capture apparatuses (a digital still camera, video camera, etc.), mobile terminals having an image capture function (a mobile telephone, etc.), a copier that employs an image capture apparatus as an image reader, and the like.

Figure 11:
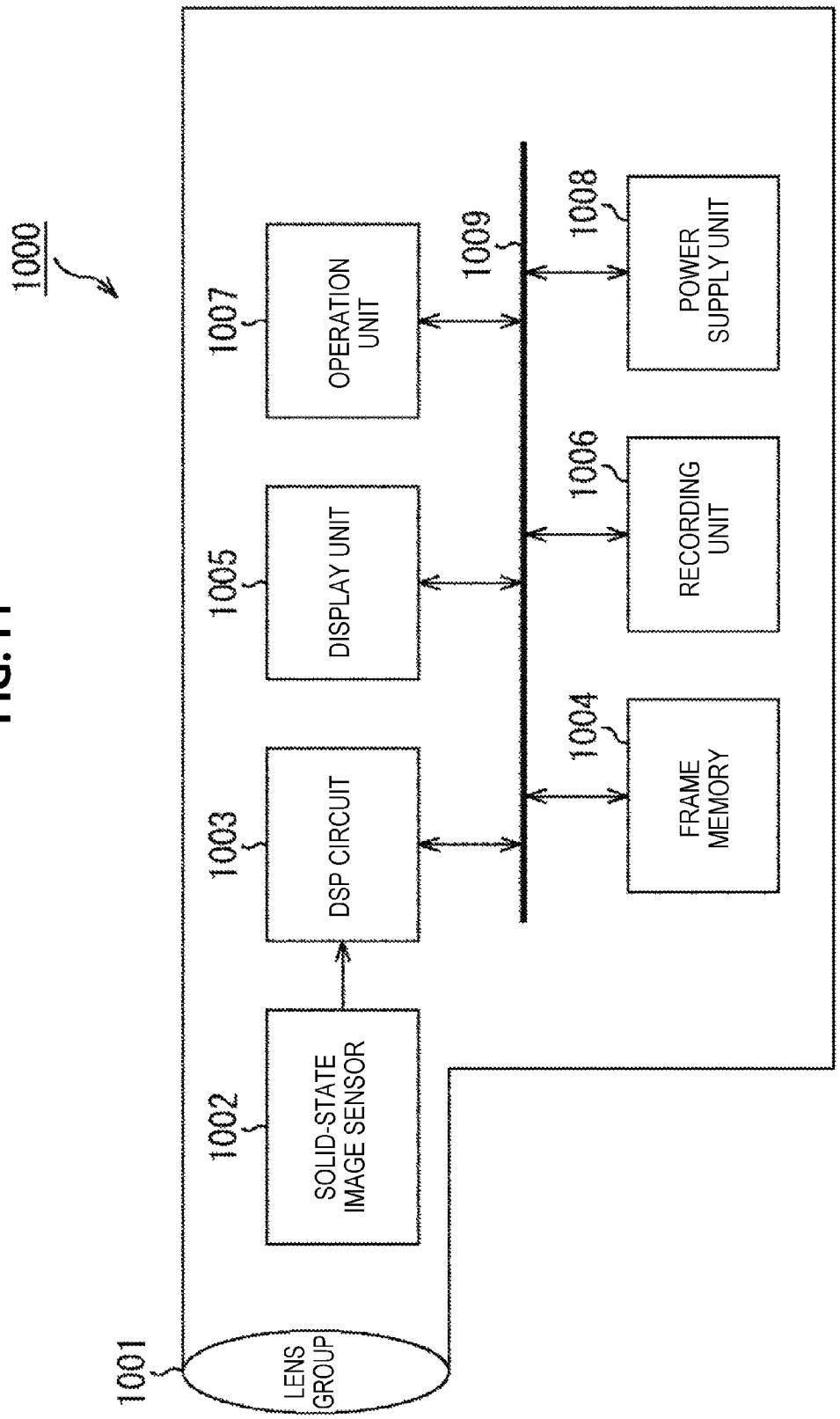
FIG. 11 is a diagram for describing a configuration of an electronic apparatus.

FIG. 11 is a block diagram showing an example configuration of an electronic apparatus according to the present technology, such as an image capture apparatus. As shown in FIG. 11, an image capture apparatus 1000 according to the present technology includes an optical system including a lens group 1001 and the like, an image sensor (imaging device) 1002, a DSP circuit 1003, a frame memory 1004, a display device 1005, a recording device 1006, an operation system 1007, a power supply system 1008, and the like. Also, the DSP circuit 1003, the frame memory 1004, the display device 1005, the recording device 1006, the operation system 1007, and the power supply system 1008 are connected together through a bus line 1009.

The lens group 1001 brings incident light (image light) from an object to a focus on an imaging surface of the image sensor 1002. The image sensor 1002 converts the amount of incident light brought by the lens group 1001 to a focus on the imaging surface, into electrical signals using pixel units, and outputs the electrical signals as pixel signals.

The display device 1005, which is a panel display device, such as a liquid crystal display device, electroluminescence (EL) display device, or the like, displays a moving image or still image captured by the image sensor 1002. The recording device 1006 records a moving image or still image captured by the image sensor 1002 to a recording medium, such as a video tape, digital versatile disk (DVD), or the like.

The operation system 1007 outputs operation instructions for various functions of the image capture apparatus according to the user's operation. The power supply system 1008 supplies various power supplies that are operation power supplies for the DSP circuit 1003, the frame memory 1004, the display device 1005, the recording device 1006, and the operation system 1007, to these parts to which power is to be supplied, as appropriate.

The image capture apparatus thus configured may be used as an image capture apparatus, such as a video camera or a digital still camera, a camera module for a mobile apparatus (a mobile telephone, etc.), or the like. Also, in the image capture apparatus, the above semiconductor package can be used as the image sensor 1002.

As used herein, the system refers to an entire apparatus including a plurality of apparatuses.

Note that embodiments of the present technology are not limited to the above embodiments, and various changes can be made without departing the scope or spirit of the present technology.

Additionally, the present technology may also be configured as below.

(1)
A semiconductor device including:
a multilayer substrate including an optical element;
a light-transmitting plate provided on the substrate to cover the optical element; and
a lens of an inorganic material provided between the substrate and the light-transmitting plate,
wherein a structure having a same strength as a strength per unit area of the lens is provided at a portion outside an effective photosensitive region where the optical element is formed, when the substrate is viewed in plan.

(2)
The semiconductor device according to (1), further including:
a first organic material layer provided below the lens; and
a second organic material layer provided above the lens.

(3)
The semiconductor device according to (1) or (2),
wherein the structure has a same shape as the lens and is formed of the inorganic material.

(4)
The semiconductor device according to any of (1) to (3),
wherein the structure is a flat film that is formed of a same material as the lens and has a same volume per unit area as the lens.

(5)
The semiconductor device according to any of (1) to (3).
wherein the structure is a flat film that is designed to have a same strength per unit area as the lens.

(6)
The semiconductor device according to any of (1) to (3), further including:
a film having one end provided as an extension of the lens and the other end connected to a predetermined layer of the substrate.

(7)
The semiconductor device according to (6),
wherein the film is continuously provided to surround the effective photosensitive region.

(8)
The semiconductor device according to (6),
wherein the film is discontinuously provided to surround the effective photosensitive region.

(9)
The semiconductor device according to any of (1) to (7),
wherein the inorganic material is silicon nitride.

(10)
The semiconductor device according to any of (1) to (9),
wherein the semiconductor device is a back-illuminated image sensor.

(11)
The semiconductor device according to any of (1) to (9),
wherein the semiconductor device is a front-illuminated image sensor.

(12)
A semiconductor device including:
a multilayer substrate including an optical element;
a light-transmitting plate provided on the substrate to cover the optical element; and
a lens of an inorganic material provided between the substrate and the light-transmitting plate,
wherein a portion of the lens is connected to a predetermined layer of the substrate by a film formed of a same material as the lens.

(13)
An electronic apparatus including:
a semiconductor device including
a multilayer substrate including an optical element,
a light-transmitting plate provided on the substrate to cover the optical element, and
a lens of an inorganic material provided between the substrate and the light-transmitting plate,
wherein a structure having a same strength as a strength per unit area of the lens is provided at a portion outside an effective photosensitive region where the optical element is formed, when the substrate is viewed in plan; and
a signal processing unit that performs a signal process on a pixel signal output from the semiconductor device.

REFERENCE SIGNS LIST

100 CMOS image sensor
111 pixel array unit 200 semiconductor package
212 interconnection layer
213 silicon substrate
214 photodiode
215 protective film
216 light shield film
217 planarization film
218 color filter layer
219 first organic material layer
220 microlens layer
221 cover Mass
222 second organic material layer
251 dummy lens
252 film
301 stress adjustment film
302 film
351 stress adjustment film
352 film
401 dummy lens
402 anchoring
451 stress adjustment film
452 anchoring
501 stress adjustment film
502 anchoring
551 connection unit

The invention claimed is:

1. A package comprising:
a semiconductor substrate;
a color filter layer at a light-incident side of the semiconductor substrate;
a transparent substrate;
an effective pixel region including a plurality of photoelectric conversion regions located in the semiconductor substrate and a microlens layer, wherein the microlens layer is between the color filter layer and the transparent substrate;
an end portion;
a transition region including the microlens layer and located between the effective pixel region and the end portion, wherein the microlens layer in the transition region includes a dummy lens having a same shape as a microlens in the effective pixel region; and
an organic material layer between the dummy lens and the transparent substrate, wherein the organic material layer extends from the transition region to the end portion,
wherein,
the end portion is between an outer edge of the package and the transition region, and
an edge of the transparent substrate is coincident with the outer edge of the package.

2. The package according to claim 1, wherein the dummy lens is formed of a same material as the microlens in the effective pixel region.

3. The package according to claim 2, wherein the same material includes an inorganic material.

4. The package according to claim 2, wherein the same material includes silicon nitride.

5. The package according to claim 1, further comprising:
a silicon oxide film located at a light-incident side of the semiconductor substrate.

6. The package according to claim 5, further comprising:
a light-shielding film located above the silicon oxide film.

7. The package according to claim 1, wherein the color filter layer is in at least the effective pixel region and the transition region.

8. The package according to claim 1, further comprising:
another organic material layer located above the color filter layer.

9. The package according to claim 1, further comprising:
a support substrate at a side of the semiconductor substrate that is opposite to the light-incident side of the semiconductor substrate.

10. The package according to claim 9, further comprising:
a wiring layer between the semiconductor substrate and the support substrate.

11. The package according to claim 1, wherein the transparent substrate is cover glass.

12. The package according to claim 1, wherein the package is a chip-size package.

13. The package according to claim 1, wherein the package is a cavityless chip-size package.

14. The package according to claim 1, further comprising:
a flat film included in the end portion and formed of a same material as the microlens layer.

15. The package according to claim 14, wherein the flat film includes an anchoring portion.

16. An electric apparatus comprising:
a lens;
a signal processing circuit; and
a package including:
a semiconductor substrate;
a color filter layer at a light-incident side of the semiconductor substrate;
a transparent substrate,
an effective pixel region including a plurality of photoelectric conversion regions located in the semiconductor substrate and a microlens layer, wherein the microlens layer is between the color filter layer and the transparent substrate,
an end portion,
a transition region including the microlens layer and located between the effective pixel region and the end portion, wherein the microlens layer in the transition region includes a dummy lens having a same shape as a microlens in the effective pixel region, and
an organic material layer between the dummy lens and the transparent substrate, wherein the organic material layer extends from the transition region to the end portion,
wherein,
the end portion is between an outer edge of the package and the transition region, and
an edge of the transparent substrate is coincident with the outer edge of the package.

17. The apparatus according to claim 16, wherein the dummy lens is formed of a same material as the microlens in the effective pixel region.

18. The apparatus according to claim 17, wherein the same material includes an inorganic material.

19. The apparatus according to claim 17, wherein the same material includes silicon nitride.

20. The apparatus according to claim 16, further comprising:
a silicon oxide film located at a light-incident side of the semiconductor substrate.

21. The apparatus according to claim 20, further comprising:
a light-shielding film located above the silicon oxide film.

22. The apparatus according to claim 16, wherein the color filter layer is in at least the effective pixel region and the transition region.

23. The package according to claim 16, further comprising:
 another organic material layer located above the color filter layer.

24. The package according to claim 16, further comprising:
 a support substrate at a side of the semiconductor substrate that is opposite to the light-incident side of the semiconductor substrate.

25. The package according to claim 24, further comprising:
 a wiring layer between the semiconductor substrate and the support substrate.

26. The package according to claim 16, wherein the package is a chip-size package.

27. The package according to claim 16, wherein the package is a cavityless chip-size package.

28. The package according to claim 16, further comprising:
 a flat film included in the end portion and formed of a same material as the microlens layer.

* * * * *